United States Patent [19]

Yoshikawa et al.

[11] Patent Number: 4,703,222

[45] Date of Patent: Oct. 27, 1987

[54] HALL ACCELERATOR WITH PREIONIZATION DISCHARGE

[75] Inventors: Kiyoshi Yoshikawa, Kyoto; Hisayuki Toku, Uji; Makoto Ueda, Ohtsu; Hiroshi Tamagaki, Kakogawa, all of Japan

[73] Assignee: Kyoto University, Kyoto, Japan

[21] Appl. No.: 716,368

[22] Filed: Mar. 26, 1985

[30] Foreign Application Priority Data

Aug. 31, 1984 [JP] Japan .............................. 59-182463

[51] Int. Cl.⁴ .......................... H05H 1/00; H01J 27/00
[52] U.S. Cl. ............................... 313/362.1; 313/359.1; 315/111.81; 250/423 R
[58] Field of Search ............... 313/359.1, 360.1, 362.1; 315/111.81; 204/298; 250/423 R, 427

[56] References Cited

U.S. PATENT DOCUMENTS 4,122,347 10/1978 Kovalsky et al. .................. 250/427
4,179,351 12/1979 Hawton, Jr. et al. .............. 204/298

OTHER PUBLICATIONS

Spangenberg, Karl R., *Vacuum Tubes*, pp. 621–623, McGraw-Hill, Tokyo.
Redhead, P. A., *Canadian Journal of Physics*, vol. 36, No. 3, Mar. 1958, pp. 255–270, "The Townsend Discharge in a Coaxial Diode with Axial Magnetic Field".
Vossen, John L., and Kern, Werner, *Thin Film Processes*, pp. 76–113, Academic Press, N.Y., 1978.
Jepsen, R. L., *Journal of Applied Physics*, vol. 32, No. 12, Dec. 1961, pp. 2619–2626, "Magnetically Confined Cold-Cathode Discharges at Low Pressures".
Wasa, Kiyota, and Hayakawa, Shigeru, *The Review of Scientific Instruments*, vol. 40, No. 5, May 1969, pp. 693–697, "Low Pressure Sputtering System of the Magnetron Type".
Yoshikawa, K. et al, *Fusion Technology*, vol. 8, No. 1, Jul. 1985, pp. 405–410, "Performance Characteristics of a Hall Accelerator with Preionization Discharge (Hapid)".
Cole, H. C., *Nuclear Fusion*, 1970, pp. 271–275, "A High-Current Hall Accelerator".
Cole, H. C. et al., *Fusion Technology*, 1975, pp. 21–26, "The Hall Accelerator as a Reactor Divertor Simulator".

*Primary Examiner*—Palmer C. DeMeo
*Assistant Examiner*—Theodore Salindong
*Attorney, Agent, or Firm*—Spencer & Frank

[57] ABSTRACT

The anode means of a Hall accelerator with a main discharge area has coaxial cylindrical electrodes aligned with the longitudinal axis of the main discharge area and an auxiliary electromagnet surrounding the electrodes, and an electric field is applied across the cylindrical electrodes while the auxiliary electromagnet produces an axial magnetic field therebetween so that a preionization discharge area is formed in communication with the main discharge area.

4 Claims, 12 Drawing Figures

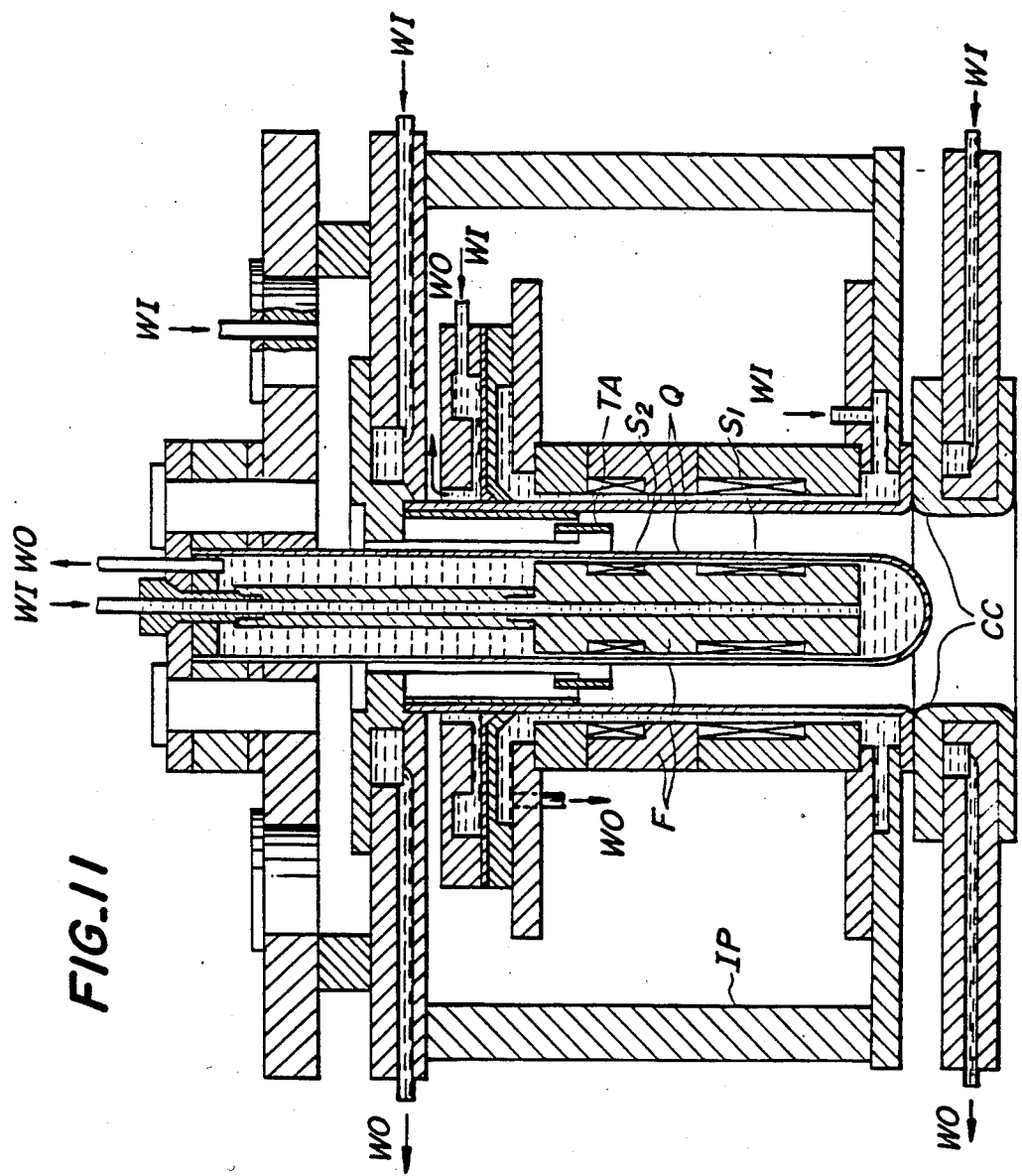

HALL ACCELERATOR WITH PREIONIZATION DISCHARGE

BACKGROUND OF THE INVENTION

1. Field of the Invention

This invention relates to a Hall accelerator having a discharge area with anode and cathode means and an electromagnet producing a magnetic field therein, which accelerator causes gas discharge therein when a gas is injected thereto so as to generate, accelerate and emit Hall ions therefrom. More particularly, the invention relates to a Hall accelerator with preionization discharge, which accelerator has a magnetron type anode means adapted to produce an auxiliary discharge thereat.

2. Description of the Prior Art

The Hall accelerator is an effective source of beam ions for ion implanting operations in semiconductor device production and in the improvement of metallic material properties. The ever increasing demand for semiconductor devices is expected to continue in the future. However, there are various limitations in the Hall ion beam produced by Hall accelerators of the prior art; namely, a comparatively large maximum current of up to one kA, a low voltage in the order of several hundreds of volts, and a comparatively wide divergence angle of about 30 degrees in case of short pulses in the order of several milliseconds.

FIG. 10 illustrates a Hall accelerator of the prior art. A discharge area with an annular cross section is defined between concentric cylindrical insulating walls IW, which discharge area is provided with a disk-shaped anode A mounted on one end thereof and a cathode C mounted on the opposite end thereof. The cathode C has a large circular opening aligned with the anode A. Iron cores F in the form of shell type with a solenoid S wound on its central leg are disposed in contact with the insulating walls IW in such a manner that a radial magnetic field is produced in the annular cross-sectional space of the discharge area. A suitable gas is directly introduced into the discharge area through a gas valve GV, so as to cause gas discharge therein for emitting ions. The Hall accelerator of such simple arrangement has a shortcoming in that, due to the heat generation at the electrodes, the ion emission is restricted to be of low voltage and short pulse duration even if a large current is possible, and a wide beam divergence angle is inevitable.

On the other hand, practical requirements for Hall accelerators from the above-mentioned industrial treatments of semiconductor and metallic materials and from nuclear fusion and other research activities demand continuous and reliable ion beams with high voltages of several kV to several hundred kV and medium currents of several A to several ten A at a small divergence angle.

To meet such requirements, the Culham Research Laboratory of England has developed an improved Hall accelerator as shown in FIG. 11. In the figure, two concentric quartz walls Q, i.e., an inner cylindrical wall and an outer tubular wall, define an elongated discharge area with an annular cross section. An annular tungsten anode TA and an annular copper cathode CC are disposed at opposite ends of the discharge area in a manner similar to that of FIG. 10. A long shell type iron core F carrying a first stage solenoid $S_1$ and a second stage solenoid $S_2$ is in contact with the quartz walls Q in such a manner that a radial magnetic field is generated in the discharge area. Thereby, the Hall accelerator of FIG. 11 emits a continuous Hall ion beam with a maximum voltage of up to 30 kV and a maximum current of up to 1.5 A for several seconds.

Although the voltage and current requirements are met by the above development, performance relating to the beam divergence angle and the stability of the Hall accelerator of FIG. 11 has not been reported yet. The direct introduction of gas into the discharge area in the last mentioned Hall accelerator implies that the conventional problems, such as the gas efficiency, the beam divergence angle, the reproducibility, the operable regions, and the like, might not have been fully solved. Besides, most of the Hall accelerators of this type have been used for pulse-like operation, and factors affecting continuous operation, such as the cooling of the electrodes in the discharge area, have not been fully considered as can be seen from the structure of FIG. 10.

The example of FIG. 11 cools the electromagnet with cooling oil and the copper cathode CC with cooling water by using coolant inlets WI and coolant outlets WO. The anode TA in the discharge area is, however, simply made of tungsten having a high melting point but not cooled. With the uncooled annular anode TA, any continuous operation for a long period of time will be difficult, because the annular anode has only a small surface area and it will be heavily bombarded by high-density electrons generated by gas discharge in the discharge area. Thus, the Hall accelerators of the prior art have a shortcoming in that long continuous operation is difficult due to the lack of anode cooling and that water cooling for the anode at a high voltage poses a structural difficulty from the standpoint of electric insulation.

SUMMARY OF THE INVENTION

Therefore, an object of the invention is to obviate the above-mentioned shortcomings of the prior art by providing an improved Hall accelerator with preionization discharge. The Hall accelerator according to the invention can continuously emit a Hall ion beam with a high voltage of 10–100 kV and a medium current of 1–10 A at a small beam divergence angle by continuous operation without using any filaments. The Hall accelerator of the invention has a number of outstanding features: namely, that it emits the Hall ion beam in a stable manner with a high reproducibility and a high gas efficiency; that it can accelerate Hall ions of various elements either individually or in combination; and that it can control the energy distribution in the ion beam over a wide range.

Another object of the invention is to provide a practicable Hall accelerator with preionization discharge capable of demonstrating the above features, which accelerator is suitable for various applications as listed below: namely, (1) An ion source for ion implanting operation in the semiconductor device industries.

(2) An ion source for ion implanting operation for improving the properties of metallic material in machine and tool industries, such as for the improvement of abrasion resistivity of metal surface by implantation of nitrogen ions.

(3) An ion source for ion implanting operation for improving corrosion resistivity of steel sheet in steel making industries, such as nitrogen ion implantation for that purpose.

(4) A laboratory ion source for irradiation on various materials.

(5) An ion source for simulating leakage plasma from nuclear fusion reactors.

In a preferred embodiment of the Hall accelerator with preionization discharge, a main discharge area with an annular cross section is formed between concentric quartz walls $Q_1$ and $Q_2$ (FIG. 1). An anode means and a cathode means are mounted on opposite ends of the discharge area. The anode means includes concentric cylindrical electrodes coaxial with the main discharge area, an anode terminal means adapted to apply a voltage across the concentric electrodes to generate an electric field therebetween, and an auxiliary electromagnet surrounding the concentric electrodes so as to generate a magnetic field in a longitudinal axial direction of the concentric electrodes, so that the anode means forms a magnetron type preionization discharge area in communication with the main discharge area. The cathode means includes an inner semispherical electrode aligned with the main discharge area, and an annular electrode surrounding the semispherical electrode with a spacing therefrom and extending away from the anode means more than the semispherical electrode. A gas inlet opening is provided so as to introduce a gas into the preionization discharge area. An electromagnet surrounds the main discharge area so as to generate a radial magnetic field therein. Whereby, the gas from the preionization discharge area is ionized into Hall ions and accelerated in the main discharge area.

Preferably, forced cooling systems are provided in those portions which are subjected to heat loading during continuous operation, such as the cylindrical electrodes of the anode means and the semispherical and annular electrodes of the cathode means.

To facilitate the control of the output Hall ion beam, a means for reversing electric current in the auxiliary electromagnet may be provided in the anode means.

BRIEF DESCRIPTION OF THE DRAWINGS

For a better understanding of the invention, reference is made to the accompanying drawings, in which:

FIG. 11 is a schematic sectional view of another Hall accelerator of the Prior art.

Throughout different views of the drawings, A is an anode, TA is a tungsten anode, $AA_1$ and $AA_2$ are coaxial anode electrodes, C is a cathode, CC is a copper cathode, $AC_1$ and $AC_2$ are coaxial cathode electrodes, DA is a main discharge area, MA is a magnetron type preionization discharge area, CA is an inner cathode-holding rod, F is an iron core, S, $S_1$, $S_2$ are solenoids of electromagnets, IW is an insulating wall, IP is an insulating support post, Q is a quartz wall, M is a MAKOR insulator, GV is a gas valve, GI is a gas inlet, WI is a coolant inlet, WO is a coolant outlet, $B_r$ is a radial magnetic field, $B_m$ is an axial magnetic field, $IO_1$ through $IO_3$ are terminals for driving currents, and $W_a$, $W_b$, $W_c$ are coolant tubes.

DESCRIPTION OF THE PREFERRED EMBODIMENTS

Figure 1:
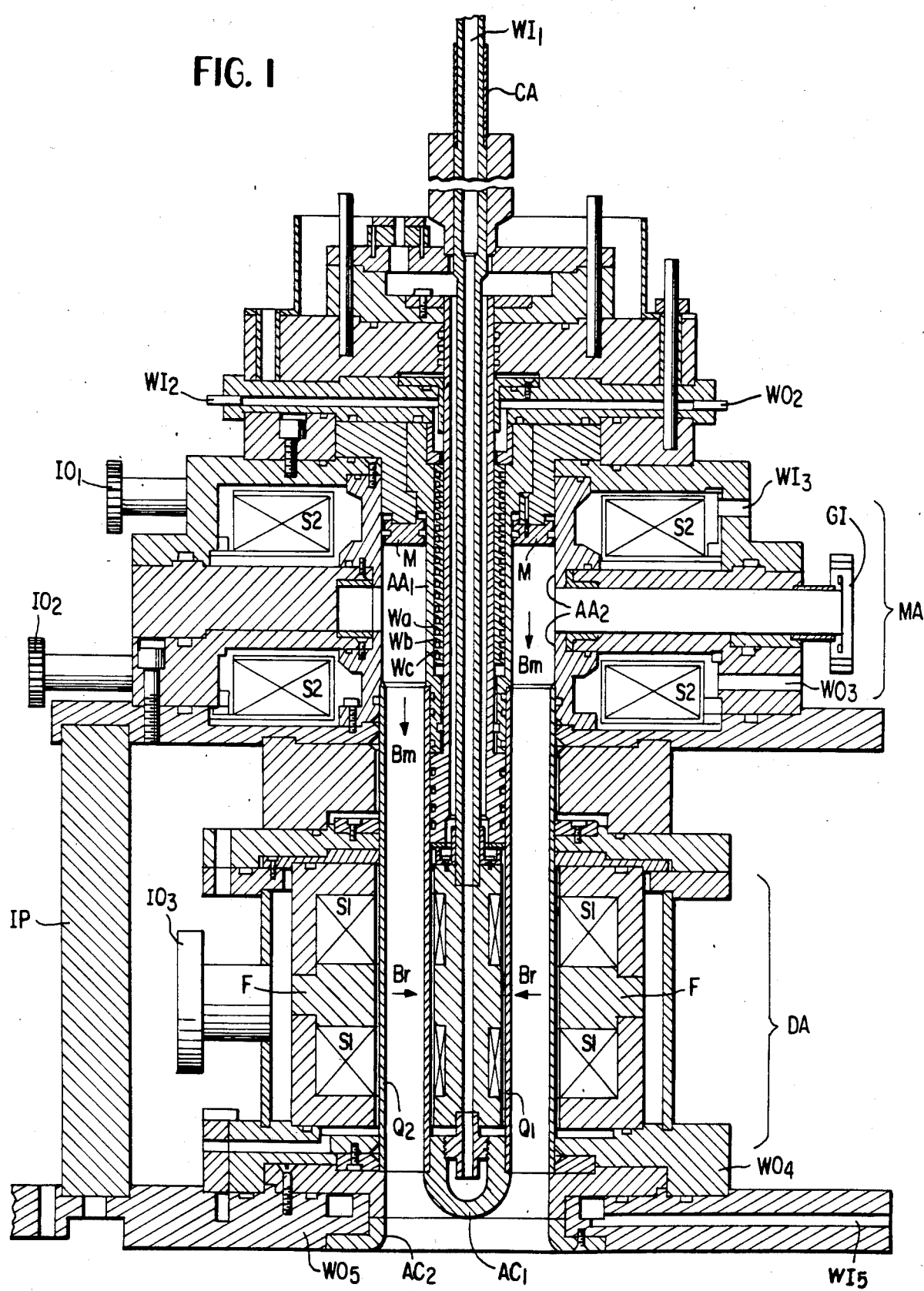
FIG. 1 is a schematic sectional view of a Hall accelerator according to the present invention.
Figure 2:
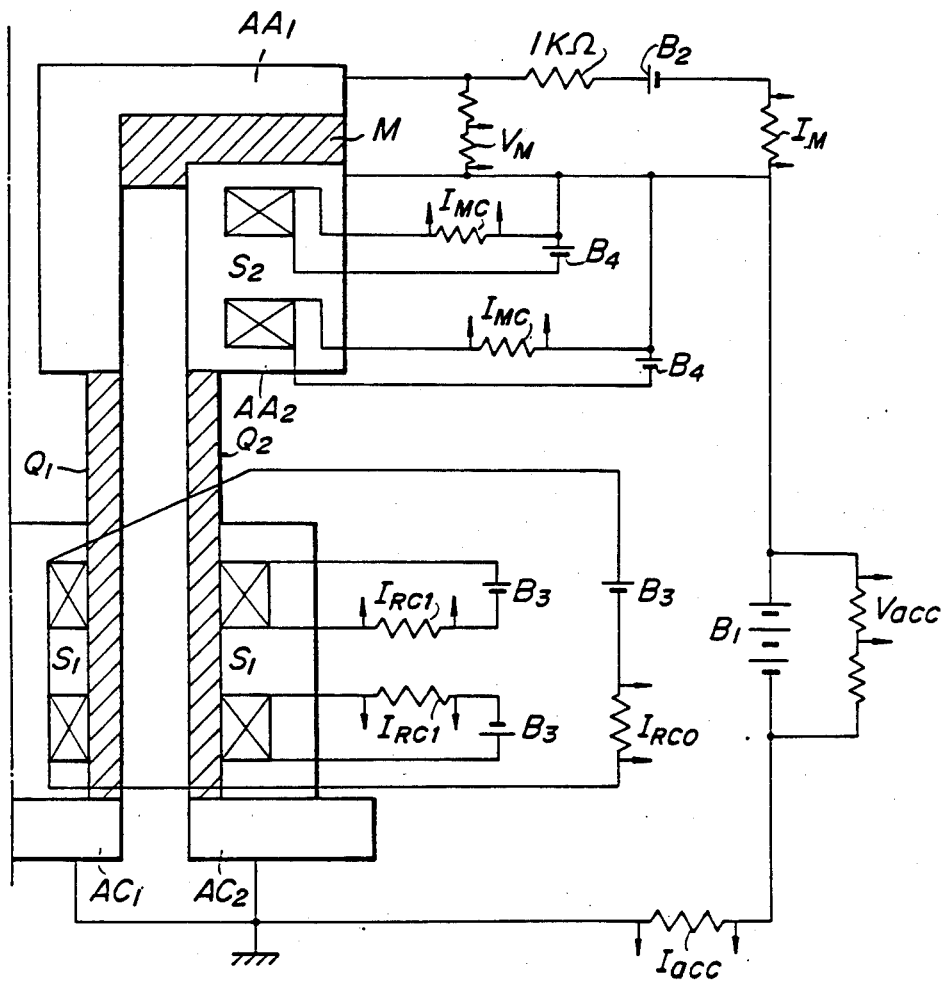
FIG. 2 is a diagrammatic illustration of the electric circuit of the Hall accelerator of FIG. 1.

The invention will be described in detail now by referring to the accompanying drawings. FIG. 1 shows a schematic sectional view of an embodiment of the Hall accelerator with preionization discharge according to the invention, while FIG. 2 shows the electric circuit of the Hall accelerator.

The Hall accelerator of the invention shown in FIG. 1 is somewhat similar to the conventional accelerator shown in FIG. 11; namely, a main discharge area with an annular or elliptic cross section is defined between concentric quartz walls $Q_1$ and $Q_2$, and an anode means $AA_1$ and a cathode means AC are mounted on opposite ends of the main discharge area DA. An elongated shell type iron core F carries a pair of first-stage solenoids $S_1$ separately wound thereon is coupled to the main discharge area DA in such a manner that a charge area DA. A suitable gas is introduced into the main discharge area through a gas inlet GI, and the gas discharge takes place therein continuously. To facilitate the continuous operation, suitable coolant, such as water or oil, is delivered to individual electrodes and electromagnets through corresponding coolant inlets $WI_1$-$WI_5$. After the cooling, the coolant is removed from the accelerator through corresponding coolant outlets $WO_1$-$WO_5$.

The Hall accelerator of FIG. 1 is clearly different from the conventional Hall accelerator shown in FIG. 11 at the following points. Namely, the anode of the conventional Hall accelerator of FIG. 11 is formed by simply disposing an annular tungsten anode TA in the main discharge area. On the other hand, in the Hall accelerator of the invention shown in FIG. 1, the anode means is formed by a pair of cylindrical electrodes $AA_1$ and $AA_2$ made of oxygen-free copper and disposed coaxially on the opposing surfaces of the inner and outer quartz walls $Q_1$ and $Q_2$ so as to face each other across the main discharge area. As shown in FIG. 2, a voltage $V_M$ of for instance several hundred V is applied across the inner electrode $AA_1$ and the outer electrode $AA_2$ of the anode means from a power source $B_2$ so as to cause an auxiliary discharge current $I_M$ to flow therethrough.

In addition to the radial magnetic field $B_r$ produced in the main discharge area DA by the two-staged solenoids $S_1$ on the electromagnet core F as in the case of conventional arrangement of FIG. 11, the Hall accelerator of the invention uses a pair of second-stage or auxiliary electromagnet solenoids $S_2$ in the form of Helmholtz coil surrounding the coaxial electrodes $AA_1$ and $AA_2$, so that an axial magnetic field $B_m$ of for instance several hundred Gauss is generated in the axial direction of the main discharge area. Thus, the orientation of the magnetic field in the proximity of the anode means thus formed is similar to that of a magnetron. In the Hall accelerator of the invention, the space between inner and outer cylindrical electrodes $AA_1$ and $AA_2$ is referred to as a magnetron type preionization discharge area MA. It is an important feature of the invention that, apart from the discharge in the main discharge area DA, an auxiliary discharge takes place in the magnetron type preionization discharge area MA, and the gas discharge in the main discharge area DA is initiated, and stabilized by such auxiliary discharge.

As will be described in more detail by referring to FIG. 3A and FIG. 3B, the axial magnetic field $B_m$ produced by the second-stage or auxiliary electromagnet solenoids $S_2$ laterally traverses a MAKOR insulator M which seals the tp end of the magnetron type preionization discharge area MA, while the radial field $B_r$ produced in the intermediate area between the first-stage solenoid $S_1$ and the second-stage solenoids $S_2$ laterally traverses the quartz walls $Q_1$ and $Q_2$ surrounding the discharge area. The insulating members at the upper and lower ends of the magnetron type preionization discharge area MA are laterally traversed by the magnetic field and electrified with negative charge. Accordingly, electrons generated by the auxiliary discharge in the magnetron type preionization discharge area MA are effectively confined in the area neighboring the anode means thanks to the combination of the magnetron like magnetic field orientation and the negative charge at the top and bottom ends thereof.

Conventionally, the magnetron type magnetic field has not been used in the neighborhood of the anode means and no axial magnetic field $B_m$ has been used, i.e., $B_m=0$, and the main gas discharge has been very unstable and its reproducibility has been low. On the other hand, the Hall accelerator of the invention uses a magnetron type preionization discharge area having an electromagnetic orientation of, for instance, an axial magnetic field of $B_m=\pm 150$ Gauss and a voltage $V_M>300$ V across the coaxial electrodes $AA_1$ and $AA_2$ of the anode means. With such magnetron type preionization discharge area, electrons confined therein ensure effective auxiliary discharge of gas injected therein, such as hydrogen gas ($H_2$), and the main discharge is highly stabilized. Consequently, Hall ions can be emitted with a high reproducibility from the Hall accelerator of the invention.

When the direction of the current through the second-stage solenoids $S_2$ in the form of Helmholtz solenoids, which produce the axial magnetic field $B_m$ in the discharge area, is reversed, the mode of synthesis of the radial magnetic field $B_r$ produced by the first-stage solenoids $S_1$ in the main discharge area DA and the axial magnetic field $B_m$ of the magnetron type preionization discharge area MA at the boundary therebetween is changed.

Figure 3A:
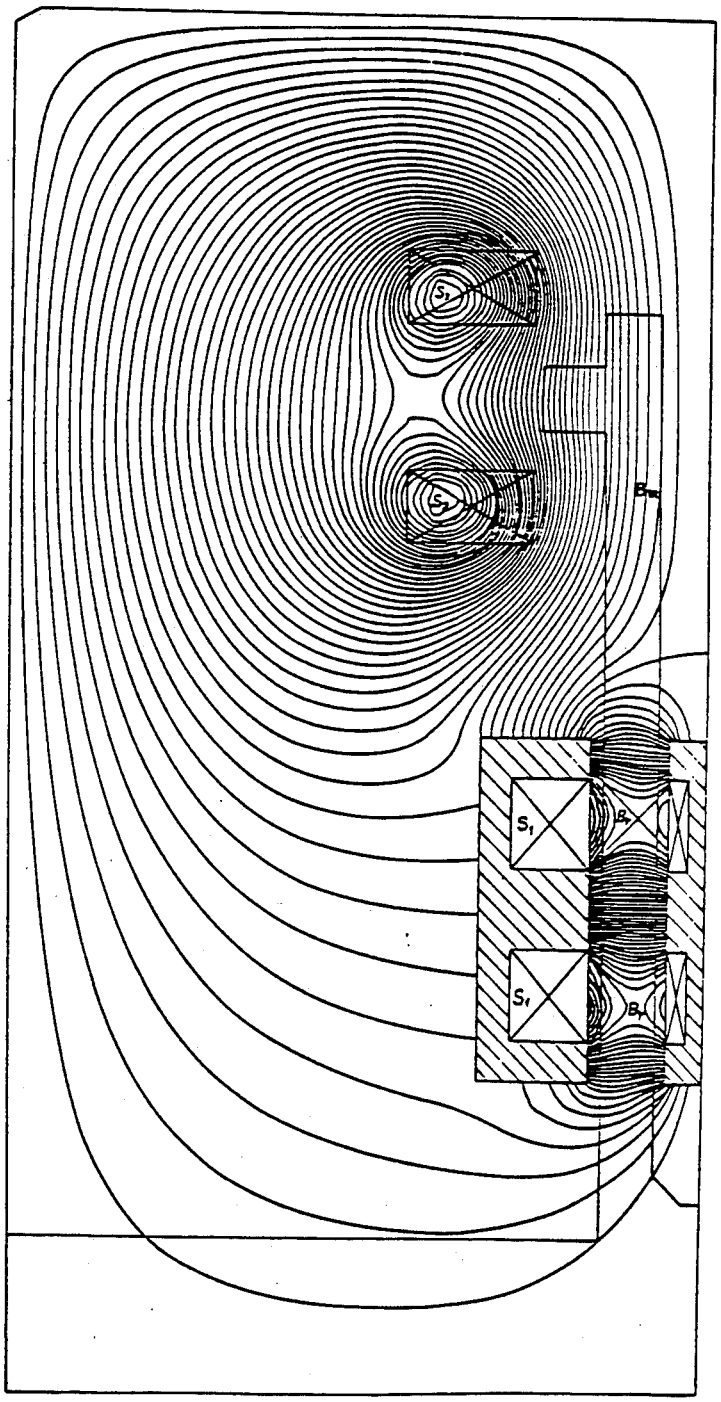
FIG. 3A is a graph showing cusp-like orientation of the magnetic field distribution in the Hall accelerator of FIG. 1.

More particularly, when the axial magnetic field is positive, i.e., $B_m>0$, as shown by the arrow $B_m$ of FIG. 1, if the current $I_{RCO}$ through first-stage solenoids $S_1$ within the inside quartz wall $Q_1$, the current $I_{RC1}$ through the individual first-stage solenoid $S_1$ facing the outside quartz wall $Q_2$, and the current $I_{MC}$ through the individual second-stage solenoid $S_2$ (see FIG. 2) assume the value of $I_{RCO} = 1.20$ A
$I_{RC1} = 1.20$ A
$I_{MC} = 2.40$ A, a cusp-like magnetic field orientation is produced as shown in FIG. 3A. In this magnetic field orientation, magnetic lines of force in the boundary region between the main discharge are DA and the magnetron type preionization discharge area MA are radially directed, so that the movement of electrons between the two areas is suppressed.

Figure 3B:
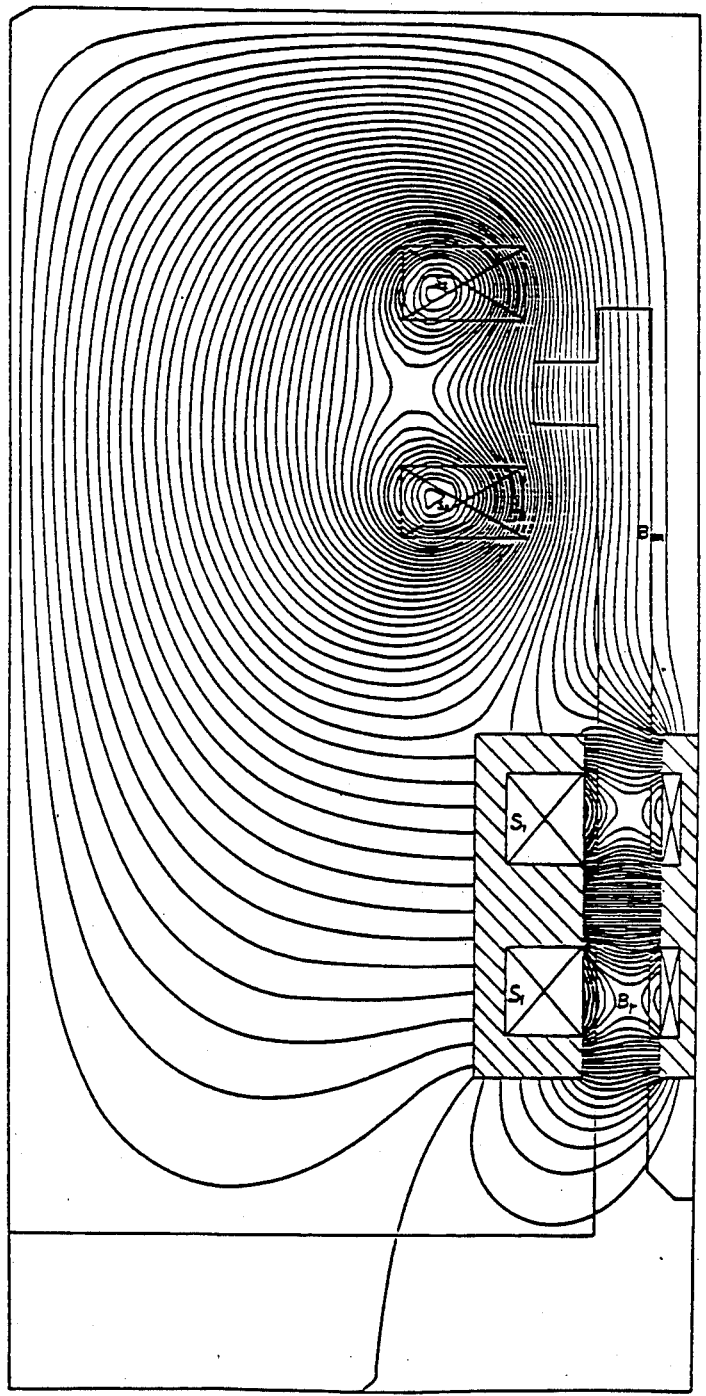
FIG. 3B is a graph showing mirror-like orientation of the magnetic field distribution in the Hall accelerator of FIG. 1.

On the other hand, when the axial magnetic field is negative, i.e., $B_m<0$, or in the opposite direction to the arrow $B_m$ of FIG. 1, if the current $I_{RCO}$ through first-stage solenoids $S_1$ within the inside quartz wall $Q_1$, the current $I_{RC1}$ through the individual first-stage solenoid $S_1$ facing the outside quartz wall $Q_2$, and the current $I_{MC}$ through the individual second-stage solenoid $S_2$ (see FIG. 2) assume the values of $I_{RCO} = 1.20$ A
$I_{RC1} = 1.20$ A
$I_{MC} = -2.40$ A, a mirror-like magnetic field orientation is produced as shown in FIG. 3B. In this magnetic field orientation, magnetic lines of force in the boundary region between the main discharge area DA and the magnetron type preionization discharge area MA are axially directed, and the suppresion of the electron movement between the two areas is released.

Figure 4:
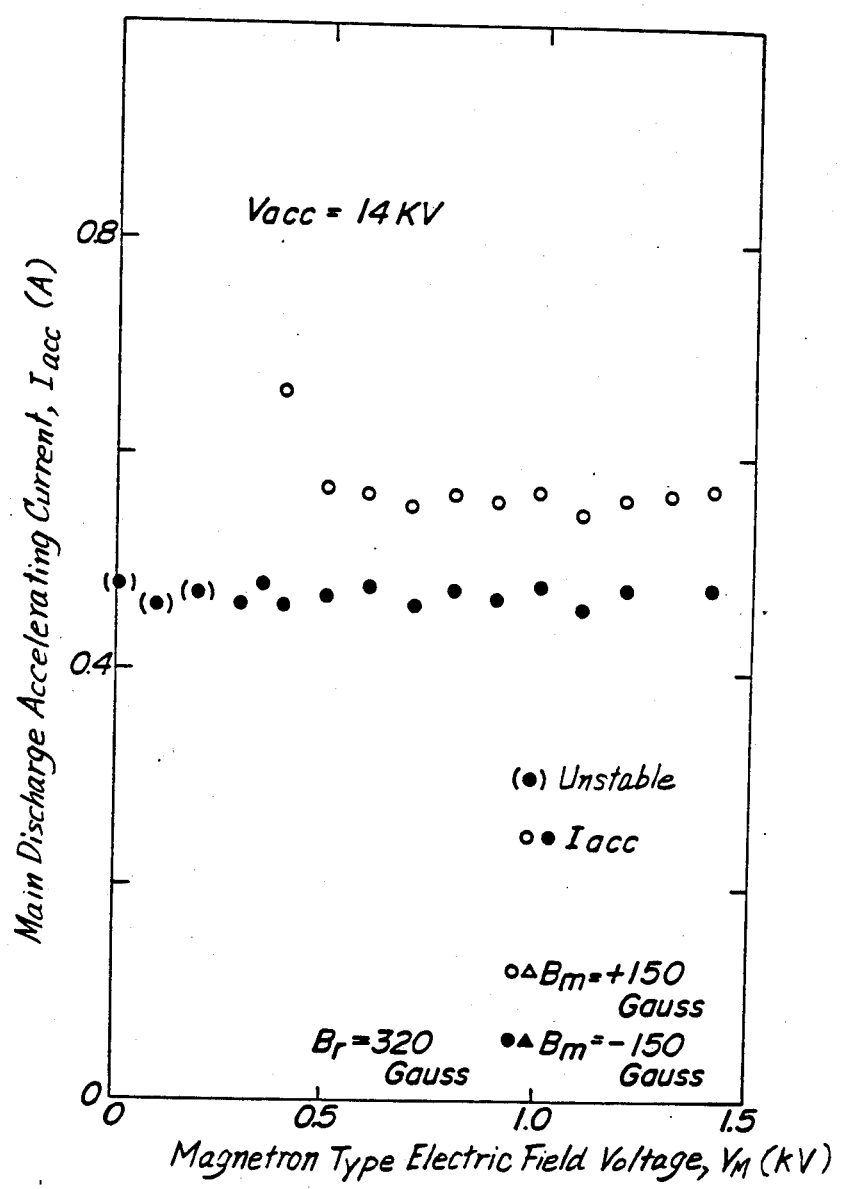
FIG. 4 is a graph showing the relationship between the main discharge accelerating current and the voltage across the concentric electrodes at the magnetron type preionization discharge area in the Hall accelerator of FIG. 1.
Figure 5:
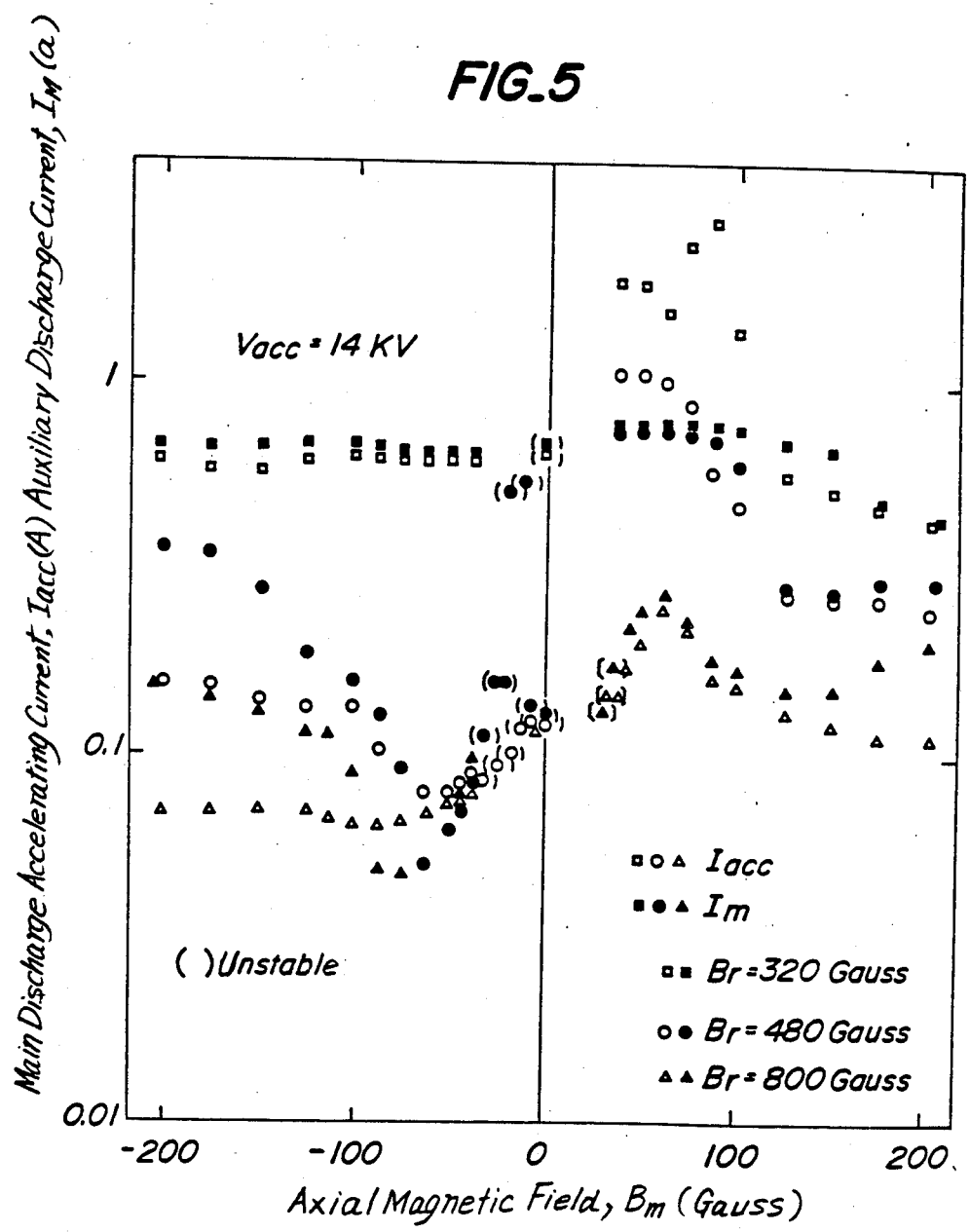
FIG. 5 is a graph showing the variation of the main discharge accelerating current and the auxiliary discharge current for different flux density levels of the axial magnetic field in the Hall accelerator of FIG. 1.

Accordingly, in response to the reversal of the direction of the current through the second-stage solenoids $S_2$, two distinct main discharge accelerating current ($I_{acc}$) vs. magnetron type electric field voltage ($V_M$) characteristics can be produced as shown in FIG. 4. The main discharge accelerating current also acts as an accelerating current of the Hall ion beam. Thus, the Hall ion beam accelerating characteristics can be controlled in a number of different ways as shown in FIG. 5, by regulating in combination the polarity and the magnitude of the exciting current for the axial magnetic field $B_m$ of the magnetron type preionization discharge area, and the magnitude of the exciting current for the radial magnetic field $B_r$.

Similarly, the generation of the auxiliary discharge in the magnetron type preionization discharge area MA can be controlled in a stable manner with a good reproducibility by regulating in combination the magnetic field being applied, the electric field being applied, and the gas inflow. With the above-mentioned structure of the anode means, that surface area of the anode means where electrons collide can be made considerably larger than that of the conventional Hall accelerator, so that continuous operation of the Hall accelerator is greatly facilitated.

The inventors actually made a test model of the Hall accelerator according to the invention and carried out a series of experiments on the test model. The experiments proved that the generation of the auxiliary discharge in the magnetron type preionization discharge area MA resulted in a high gas efficiency and ensured stable generation of Hall ion beams with a high reproducibility. Further, the test model demonstrated that its output was not restricted to Hall ion beams of one kind element, such as hydrogen ($H_2$) ions, but Hall ions of different kinds could be mixed together, accelerated and emitted by the test model.

It should be noted that the Hall accelerator of the invention considerably improves the convergence of the Hall ion beams. As compared with the simple annular copper cathode CC in the conventional Hall accelerator of FIG. 11, the Hall accelerator of the invention shown in FIG. 1 uses a more sophisticated cathode formation, namely a concentric combination of a semispherical inner copper cathode electrode $AC_1$ and an annular outer copper cathode electrode $AC_2$, the outer electrode $AC_2$ extending in the ion beam emitting direction slightly more than the inner electrode $AC_1$. When the electric potentials of the inner and outer cathode electrodes $AC_1$ and $AC_2$ are kept the same as shown in FIG. 2, equipotential lines of the electric field applied thereto has a recessed portion with a bottom on the central axis of the concentric cathode electrodes. With the formation of the cathode means of the invention, the convergence of the Hall ion beam emitted through the central opening of the annular outer cathode electrode $AC_2$ is considerably improved as compared with that in the case of the simple annular copper cathode CC alone.

Figure 6:
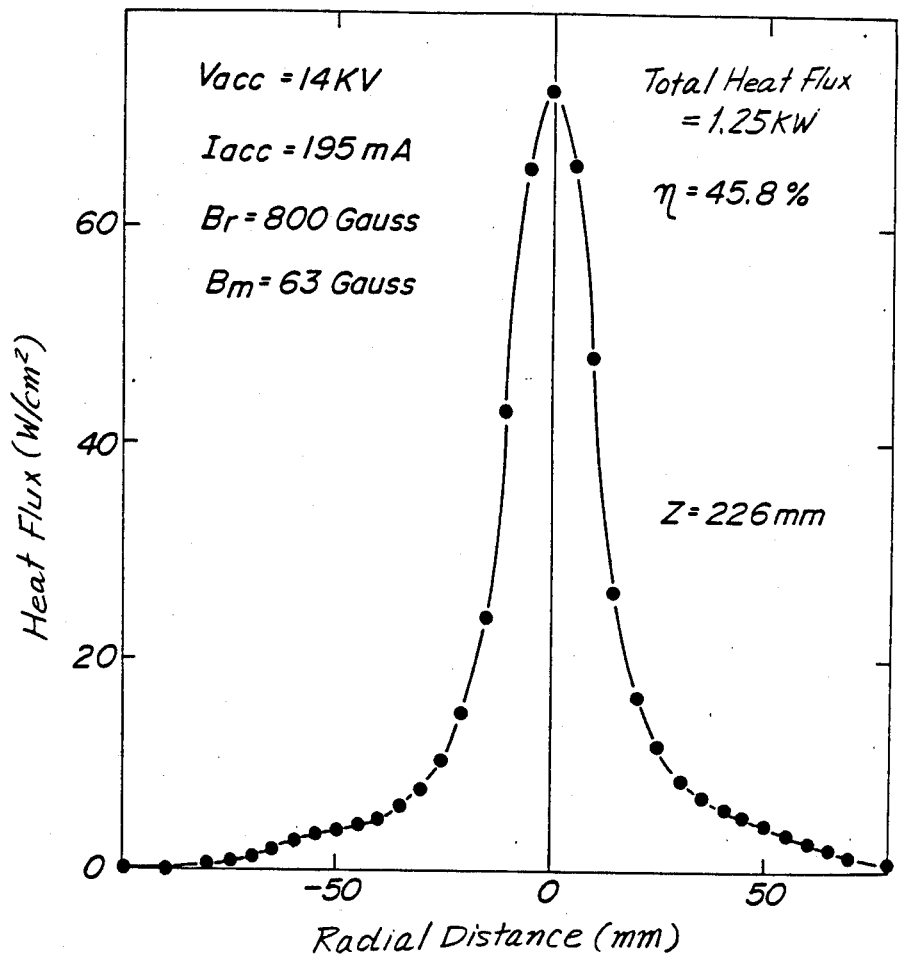
FIG. 6 is a graph showing the heat flux distribution in a Hall ion beam emitted by the Hall accelerator of the invention.

For instance, the heat flux distribution in radial direction of an ion beam emitted by the Hall accelerator of the invention was measured at a position separated from the cathode opening by a distance of 226 mm. The result as shown in FIG. 6 proved excellent convergence.

Figure 7:
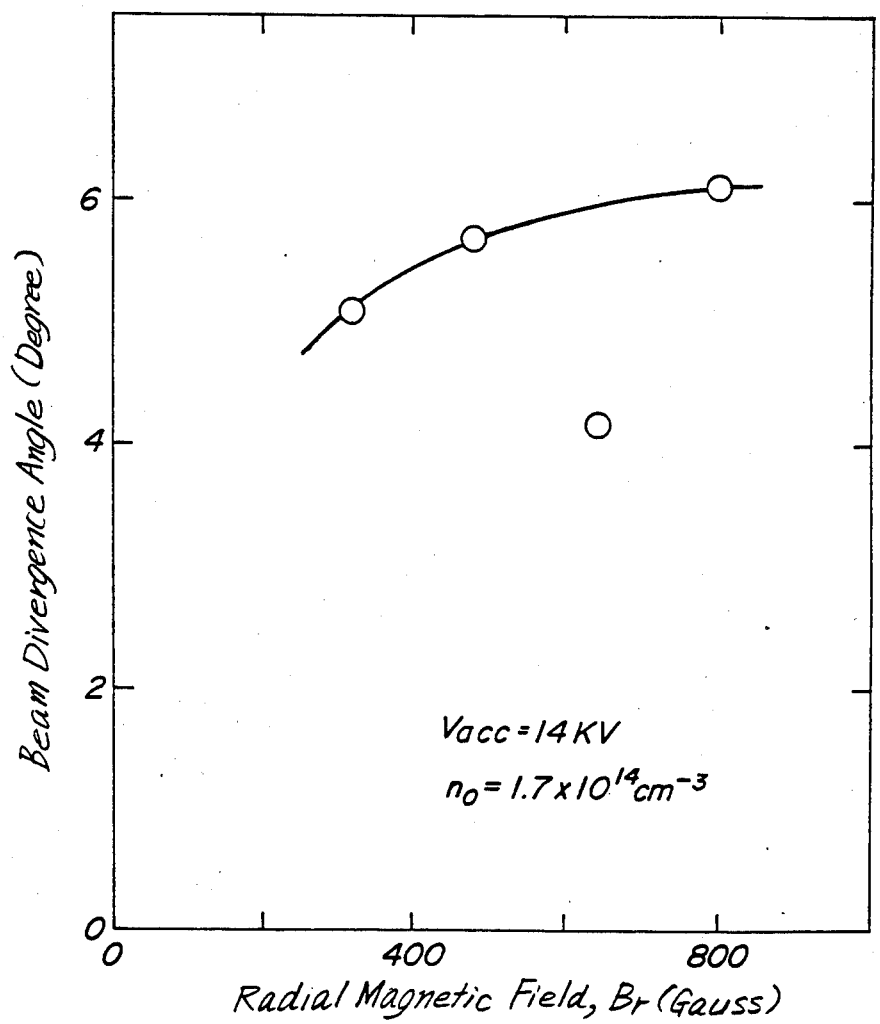
FIG. 7 is a graph showing the relationship between the beam divergence angle and the flux density of the radial field in the main discharge area in the Hall accelerator of FIG. 1.

The test model also demonstrated excellent efficiency; namely, the output efficiency $\eta$ in terms of the ratio of the extracted power to the input power was 46%, which represented a remarkable improvement over the prior art due to the use of the magnetron type preionization discharge area MA. Besides, the Hall accelerator of the invention succeeded in considerably improving the beam divergence angle from the conventional level of some 30 degrees to about 6 degrees as shown in FIG. 7. This significant reduction of the beam divergence angle appears to be due to the combined use of the magnetron type preionization discharge area MA and the above-mentioned coaxial formation of the cathode means with electrodes $AC_1$ and $AC_2$.

To facilitate the continuous operation, as pointed out above, the Hall accelerator of the invention as shown in FIG. 1 uses forced water or oil cooling systems at all the portions where heat load is applied; namely, the coaxial anode electrodes $AA_1$ and $AA_2$, the concentric cathode electrodes $AC_1$ and $AC_2$, and first-stage and second-stage electromagnet solenoids $S_1$ and $S_2$. At the anode electrodes to which a high electric potential is applied, the magnetron type electric and magnetic fields must be maintained. To this end, the inside surface of the inner cylindrical anode electrode $AA_1$ held at a high potential must be cooled by cooling water at the ground potential.

This anode cooling poses a difficult problem. More specifically, as can be seen from FIG. 1, the cylindrical anode electrode $AA_1$ has an inner cathode-electrode-holding rod CA of the ground potential extending therethrough, so that the semispherical inner cathode electrode $AC_1$ is held in alignment with the inner cylindrical anode electrode $AA_1$. The emission of the Hall ion beam from the cathode opening requires the inner cathode-electrode-holding rod CA to be of cantilever structure. Accordingly, the fixed end of the rod CA must be used for pouring in and draining out the cooling water for cooling both the anode electrode $AA_1$ at a high potential and the inner cathode electrode $AC_1$ at the ground potential. Therefore, the cooling water must descend and ascent through the narrow gap between the cylindrical inner anode electrode $AA_1$ and the inner cathode-electrode-supporting rod CA while performing three functions; namely, cooling the inner surface of the anode electrode $AA_1$, maintaining the electric insulation between the anode electrode $AA_1$ at a high potential and the rod CA at the ground potential, and providing the vacuum sealing.

To carry out the forced cooling under such difficult conditions, the inner cathode-electrode-holding rod CA of the embodiment of FIG. 1 has a double-pipe construction, and the cooling water for the inner cathode electrode $AC_1$ is fed through the innermost tube and guided to pour out to the outer tube at the inner cathode electrode $AC_1$. At the inner cylindrical anode electrode $AA_1$, a three-layer cylindrical water-cooling channel is provided, and double spiral grooves are formed in each layer of the water-cooling channel. BAITON O rings are disposed at suitable intervals so as to ensure both the electric insulation and the vacuum sealing. The cooling water descends and ascends along the double spiral grooves.

Figure 8:
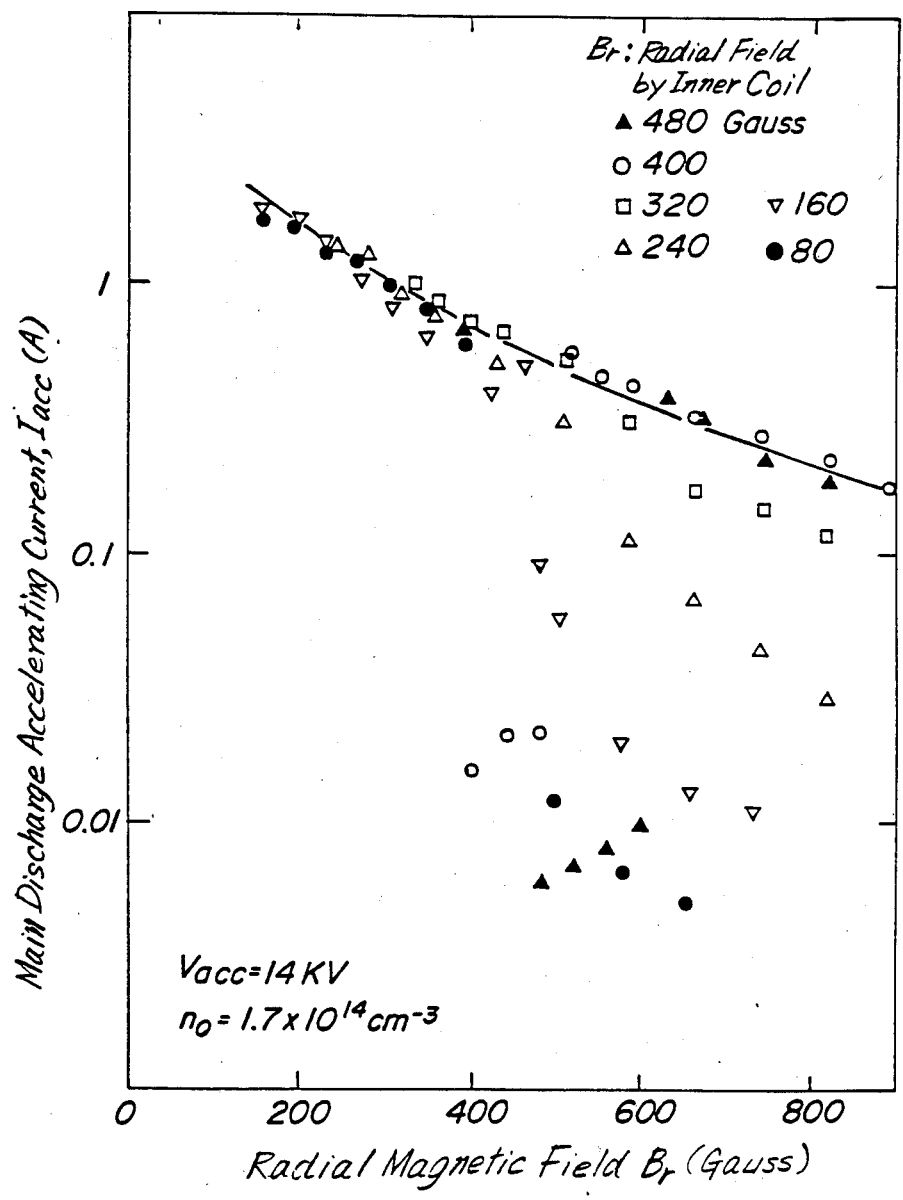
FIG. 8 is a graph showing the relationship between the main discharge accelerating current and the flux density of the radial field in the main discharge area in the Hall accelerator of FIG. 1.
Figure 9:
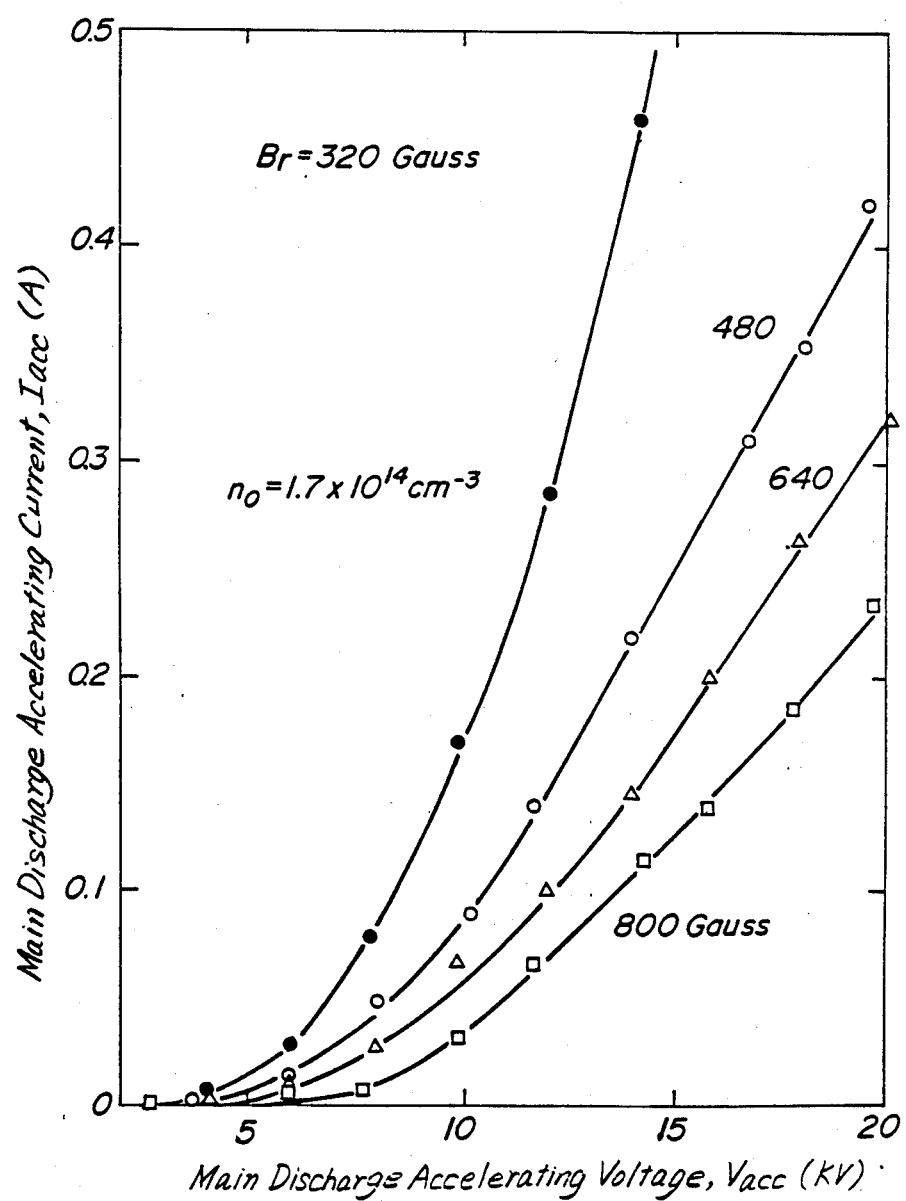
FIG. 9 is a graph showing the relationship between the main discharge accelerating current and the main discharge accelerating voltage in the Hall accelerator of FIG. 1.
Figure 10:
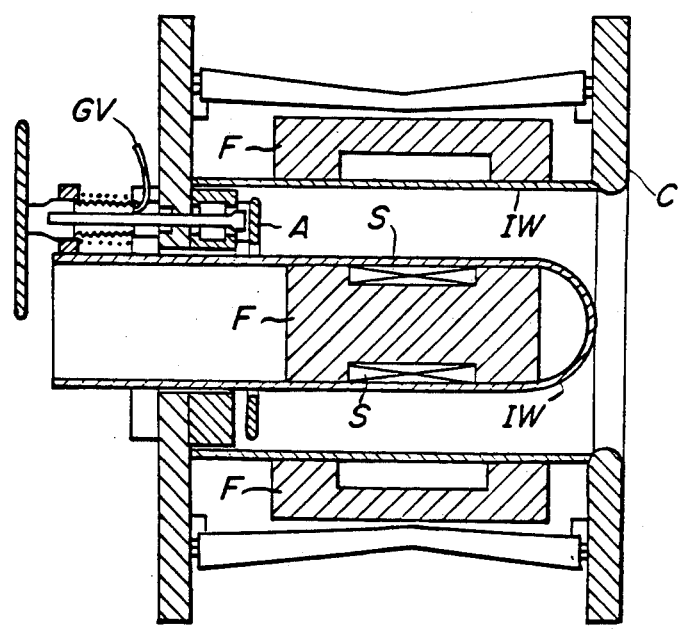
FIG. 10 is a schematic sectional view of a conventional Hall accelerator.

In the Hall accelerator of the invention as explained in the foregoing by referring to FIGS. 1 and 2, the main discharge accelerating current ($I_{acc}$) vs. the radial magnetic field ($B_r$) characteristics as shown in FIG. 8 and the main discharge accelerating current ($I_{acc}$) vs. the main discharge accelerating voltage ($V_{acc}$) characteristics as shown in FIG. 9 can be achieved by controlling in combination the axial magnetic field $B_m$ in the magnetron like preionization discharge area MA, the voltage $V_M$ across the inner and outer cylindrical anode electrodes $AA_1$ and $AA_2$, and the radial magnetic field $B_r$ in the main discharge area DA.

The duration of the ion beam emission in the Hall accelerator of the invention is controlled, for instance, by electronically regulating a gas inlet valve disposed at the gas inlet GI of FIG. 1, which gas inlet valve has a gas passage gap whose magnitude is electronically controllable by a piezo-electric element. The ion beam can be accurately controlled with an excellent reproducibility, so as to emit the desired amount of ions for a desired period of time, by suitably selecting parameters of the electronically controllable gas valve.

As compared with the prior art, the range of stable operation of the Hall accelerator of the invention is remarkably expanded by the use of the auxiliary discharge at the magnetron type preionization discharge area MA in the proximity of the anode means. Thus, the so-called dynamic range is greatly enhanced. The Hall accelerator of the invention can produce a mixed Hall ion beam at a high gas efficiency, which mixed Hall ion beam simultaneously contains different kinds of ions. Since no filament is used, the Hall accelerator can emit oxygen ion beams at a high speed at least from the theoretical point of view.

As described in the foregoing, a Hall accelerator according to the present invention has at least three major structural improvements over the prior art:

namely, that a magnetron type preionization discharge area is provided in the proximity of an anode means; that a cathode means is formed of a coaxial combination of an inner semispherical electrode and an outer annular electrode, the outer electrode extending toward ion emitting direction more than the inner electrode so as to cause a recess toward the inner electrode in electric field at the ion emitting end of the accelerator; and that forced cooling systems are provided in all those portions which are subjected to heat loading during continuous operation, while ensuring electric insulation and the vacuum sealing.

Whereby, various outstanding features in performance have been achieved; namely, that Hall ion beams at a high voltage with a medium current can be accelerated and emitted on the basis of continuous operation, with a high reproducibility and a high gas efficiency, over a considerably wider stability range than that of the prior art; that ions of a number of different kinds can be simultaneously emitted.

Thus, the Hall accelerator according to the invention has a comparatively simple structure and yet can continuously emit high-energy ion beams at a high efficiency, which ion beams have considerably improved properties over the prior art. Further, since no filaments are used, maintenance work is hardly necessary. Therefore, the Hall accelerator of the invention suits best the purpose of providing ion sources for ion implanting operations in a very wide variety of industrial fields.

Practical examples of industrial activities in which the Hall accelerators with preionization discharge according to the invention can be advantageously used are as follows:

(a) An ion source for ion implantation in the semiconductor device production. To this end, ion beams of substantially single energy level with a medium current of about 10 A can be produced by forming the main discharge area close to the anode means while extending the weak radial magnetic field to the proximity of the upper end of the cathode means.

(b) An oxygen ion source for ion implantation and insulation in the semiconductor device production. To this end, the electrodes of the anode means and the cathode means can be made of hardly oxidizable metals, such as stainless steel, or can be coated with platinum.

(c) An ion source for implanting carbon ions, nitrogen ions, or other ions in steel or other metallic members such as steel sheets in machine and tool production to improve the surface abrasion resistivity. To this end, the Hall accelerator of the invention can be operated with a comparatively high discharge voltage so as to ensure the effective ion implantation into continuously moving workpieces in an environment having a differential ventilation system.

Although the invention has been described with a certain degree of particularity, it is understood that the present disclosure has been made only by way of example and that numerous changes in details of construction and the combination and arrangement of parts may be restored to without departing from the scope of the invention as hereinafter claimed.

What is claimed is:

1. A Hall accelerator with preionization discharge, comprising a main discharge area having an anode means and a cathode means coupled to opposite ends thereof respectively; said anode means having inner and outer concentric cylindrical electrodes coaxial with said main discharge area, an anode terminal means adapted to apply a voltage across the concentric electrodes to generate an electric field therebetween, and an auxiliary electromagnet surrounding said concentric electrodes so as to generate a magnetic field in a longitudinal axial direction of the concentric electrodes, so that said anode means forms a magnetron type preionization discharge area in communication with said main discharge area; said anode means further having forced cooling means for cooling both said inner and outer cylindrical electrodes; said cathode means having an inner semispherical electrode aligned with said main discharge area, and an annular electrode surrounding said semispherical electrode with a spacing therefrom and extending away from said anode means more than said semispherical electrode; a gas inlet having an opening toward said preionization discharge area; and an electromagnet surrounding said main discharge area so as to generate a radial magnetic field therein, thereby gas from said preionization discharge area is ionized into Hall ions and accelerated in said main discharge area.

2. A Hall accelerator with preionization discharge as set forth in claim 1, wherein each of said cylindrical electrodes of the anode means and the semispherical and annular electrodes of the cathode means has a forced cooling means mounted thereon.

3. A Hall accelerator with preionization discharge as set forth in claim 1, wherein said anode means has a means for reversing electric current in said auxiliary electromagnet.

4. A Hall accelerator with preionization discharge as set forth in claim 2, wherein said anode means has a means for reversing electric current in said auxiliary electromagnet.

* * * * *